US012666570B1

(12) United States Patent
Lundberg

(10) Patent No.: US 12,666,570 B1

(45) Date of Patent: Jun. 23, 2026

(54) INTEGRATED TWO-PHASE IMMERSION COOLING SYSTEM WITH ENHANCED BOILING AND PREDICTIVE FLUID AND CONDENSATION CONTROL

(71) Applicant: Peter Herbert Lundberg, Stayton, OR (US)

(72) Inventor: Peter Herbert Lundberg, Stayton, OR (US)

(73) Assignee: Predictive Thermal Systems, LLC, Stayton, OR (US)

( * ) Notice: Subject to any disclaimer, the term of this patent is extended or adjusted under 35 U.S.C. 154(b) by 0 days.

(21) Appl. No.: 19/433,579

(22) Filed: Dec. 26, 2025

(51) Int. Cl.
*H05K 7/20* (2006.01)

(52) U.S. Cl.
CPC ......... *H05K 7/203* (2013.01); *H05K 7/20318* (2013.01); *H05K 7/20381* (2013.01)

(58) Field of Classification Search
CPC .............................. H05K 7/203; H10W 40/30
See application file for complete search history.

(56) References Cited

U.S. PATENT DOCUMENTS 8,619,425 B2 12/2013 Mudawar
10,405,457 B2 9/2019 Kandikar
11,129,298 B2 9/2021 Bar-Cohen et al.
2015/0245539 A1* 8/2015 Pelletier ............ H05K 7/20236 361/679.53
2016/0345461 A1* 11/2016 Smith ................ H05K 7/20381
2019/0357378 A1* 11/2019 Kolar ................ H05K 7/20327
2020/0305310 A1* 9/2020 Alissa .................... H05K 7/203
2024/0049427 A1* 2/2024 Chang .................... H05K 7/203
2025/0287532 A1* 9/2025 Lau .................... H05K 7/20281

FOREIGN PATENT DOCUMENTS

EP 4068927 B1 8/2022
EP 4336982 B1 11/2023
WO WO-2025255260 A1 * 12/2025 .......... H10W 40/475

* cited by examiner

*Primary Examiner* — Eric S Ruppert

(57) ABSTRACT

An integrated two-phase immersion cooling system for electronic devices includes a tank containing a dielectric working fluid in which one or more electronic modules are immersed. Each electronic module is thermally coupled to a heat-spreading assembly supporting a boiling-enhancement surface configured to promote controlled nucleate boiling of the dielectric working fluid. Vapor generated at the boiling-enhancement surface rises into a vapor region and is guided toward a condensation assembly, where the vapor is condensed and returned to the working-fluid region through one or more condensate-return pathways. A coolant-delivery subsystem provides directed liquid-phase dielectric working fluid toward the boiling-enhancement surface to reinforce surface wetting, regulate local heat flux, and reduce reliance on bulk fluid circulation. A control subsystem receives thermal and fluidic telemetry, estimates operating states associated with phase-change behavior, and regulates liquid delivery, circulation, and condensation operation to maintain stable two-phase cooling while reducing energy consumption across operating conditions.

21 Claims, 16 Drawing Sheets

INTEGRATED TWO-PHASE IMMERSION COOLING SYSTEM WITH ENHANCED BOILING AND PREDICTIVE FLUID AND CONDENSATION CONTROL

STATEMENT REGARDING FEDERALLY SPONSORED RESEARCH OR DEVELOPMENT

None.

FIELD OF THE INVENTION

The present invention relates to thermal-management systems for electronic devices and, more particularly, to dielectric immersion-cooling architectures. In representative embodiments, the invention pertains to two-phase immersion systems that manage boiling, vapor transport, condensation, and liquid delivery within a controlled immersion environment. The invention further relates to cooling systems that employ adaptive or predictive control strategies to regulate phase-change behavior, coolant distribution, and heat-rejection performance in response to thermal and fluidic operating conditions.

BACKGROUND OF THE INVENTION

Electronic devices and computing architectures continue to increase in power density, resulting in highly localized and rapidly varying heat fluxes that challenge conventional cooling technologies. Air-cooling systems and single-phase liquid-cooling solutions may struggle to maintain stable operating temperatures under such conditions, particularly in systems with dense packaging, heterogeneous workloads, or concentrated hot spots.

Two-phase dielectric immersion cooling, in which electronic hardware is submerged in a boiling dielectric working fluid, has been explored as an approach for improving heat-removal capability. In typical implementations, vapor generated at heated surfaces migrates toward a condensation region, condenses, and returns as liquid to the immersion tank. While such systems may offer advantages over air or single-phase liquid cooling, many existing approaches rely primarily on passive boiling behavior or bulk fluid recirculation. As a result, these systems may provide limited control over nucleation dynamics, surface wetting, vapor-film suppression, vapor-plume behavior, or condensate return, and may exhibit instability, inconsistent condensation, or excessive pumping energy requirements.

Incremental modifications—such as alternative condenser designs, increased circulation capacity, or modified tank geometries—may address isolated performance limitations but typically do not coordinate boiling behavior, vapor transport, condensation, and localized liquid delivery within an integrated framework. Similarly, conventional thermal-control techniques have generally been applied in a reactive manner and have not been effectively adapted to the tightly coupled phase-change and fluid-dynamic interactions present in immersion environments, often responding only after thermal or hydrodynamic instability has already developed.

Accordingly, there remains a need for a dielectric immersion-cooling architecture that provides engineered boiling interfaces capable of sustaining stable nucleate boiling; controllable and localized coolant delivery without reliance on bulk recirculation; adaptable condensation suitable for varying and transient heat loads; coordinated management of vapor plumes and condensate return; and predictive control capable of stabilizing two-phase behavior before instability occurs.

SUMMARY OF THE INVENTION

The present invention provides an integrated dielectric immersion-cooling system configured to remove heat from electronic devices by coordinating boiling, vapor transport, condensation, and controlled liquid-delivery mechanisms within a unified thermal environment. In representative embodiments, the system employs two-phase heat transfer and incorporates a heat-spreading assembly, a boiling-enhancement interface, a coolant-delivery subsystem, a condensation assembly, and one or more condensate-return pathways that operate cooperatively to maintain stable cooling across a wide range of operating conditions.

In operation, heat generated by an electronic device is transferred to a boiling interface having surface features configured to promote sustained nucleate boiling of a dielectric working fluid. A coolant-delivery subsystem supplies liquid working fluid toward the boiling interface to reinforce surface wetting, modulate local thermal behavior, and suppress vapor-film formation without reliance on bulk-tank recirculation. Vapor produced at the boiling interface is conveyed to a condensation assembly that supports one or more selectable heat-rejection modes, and condensed liquid returns to a dielectric-fluid region through guided return pathways that may include passive flow-directing or check-valve structures.

System performance may be further regulated by a control subsystem configured to receive thermal and fluidic telemetry, estimate thermal or fluidic operating states indicative of phase-change behavior, and execute predictive or adaptive control logic. Based on such estimates, the control subsystem generates control signals that proactively regulate physical components of the coolant-delivery subsystem, circulation subsystem, condensation assembly, or associated flow-control elements. Through predictive coordination of these subsystems, the system maintains stable two-phase operation while reducing energy consumption associated with bulk fluid circulation or over-provisioned heat rejection.

Subsystems described herein may be implemented individually or in cooperative subsets, and variations in configuration, control strategy, or operating mode may be employed while retaining one or more advantages of the disclosed architecture.

DETAILED DESCRIPTION OF THE INVENTION

Figure 1A:
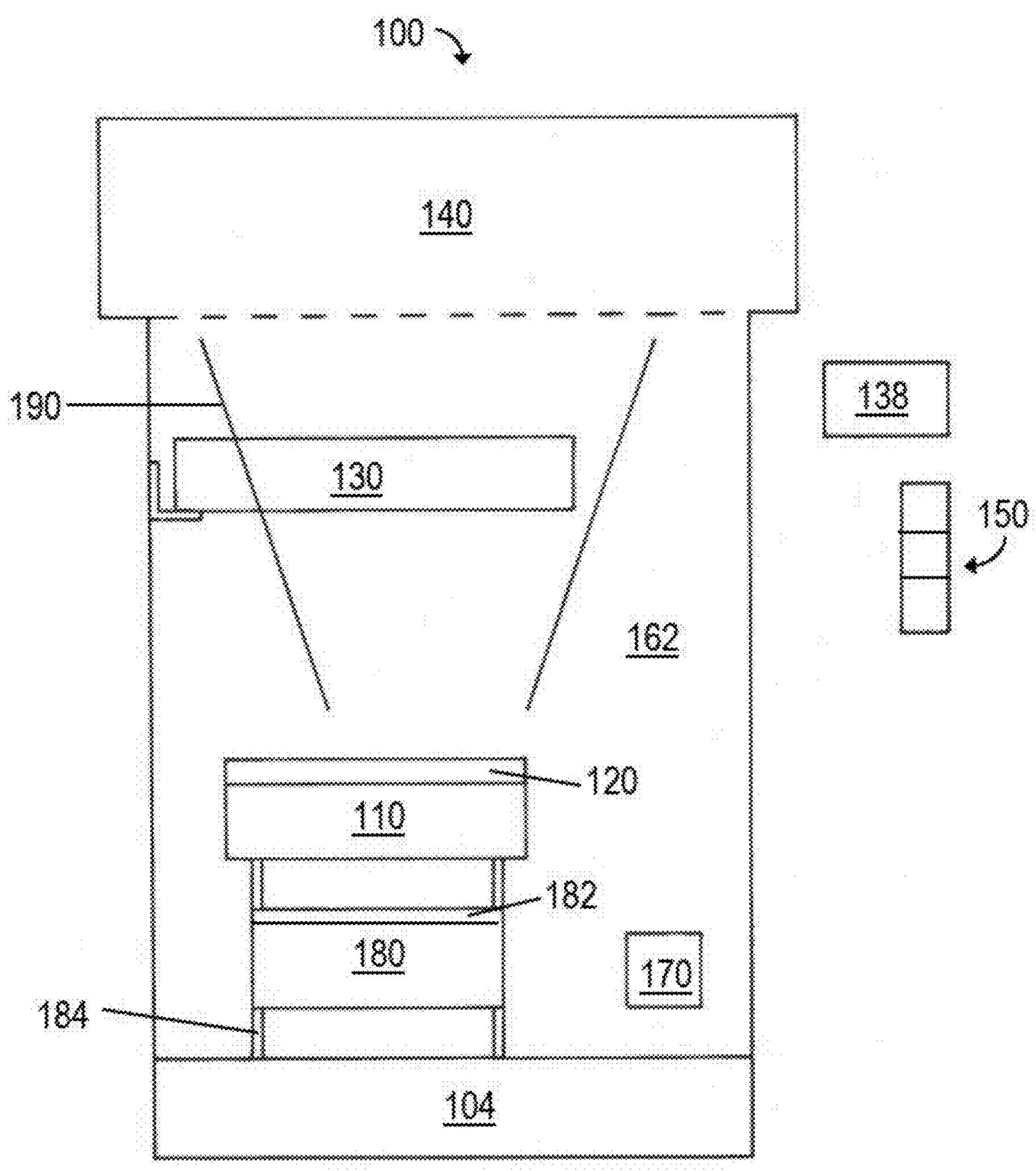
FIG. 1A shows a prospective system-level view of an integrated two-phase immersion cooling system including an immersion tank, a submerged electronic device, a boiling interface, a liquid-delivery structure, and an overhead condensation assembly.

The present disclosure relates to systems and methods for thermal management of electronic devices and, more particularly, to dielectric immersion-cooling systems that employ phase-change heat transfer. In such systems, heat generated by electronic devices is removed through coordinated boiling, vapor transport, condensation, and liquid return within a dielectric working-fluid environment. The disclosed invention addresses challenges associated with stability, efficiency, scalability, and energy consumption in immersion-based and liquid-assisted cooling by integrating engineered boiling interfaces, directed liquid delivery, adaptable condensation mechanisms, and predictive control strategies responsive to evolving thermal and fluidic conditions.

Conventional immersion-cooling systems frequently rely on passive boiling behavior, bulk fluid circulation, or reactive temperature-threshold control. Such approaches may exhibit unstable boiling, vapor blanketing, delayed condensate return, excessive pumping energy, or inefficient response to transient or spatially non-uniform heat loads. The present invention overcomes these limitations by coordinating multiple subsystems under predictive regulation that anticipates phase-change behavior and selectively actuates physical components only when and where needed.

Although representative embodiments are described with reference to the accompanying drawings, the invention is not limited to the specific configurations, arrangements, or operating modes illustrated. Individual features described herein may be implemented independently or in combination, and variations or substitutions may be employed without departing from the scope of the appended claims.

Relative Size and Placement

Although certain components are illustrated in the drawings with relative size, orientation, and positional relationships, such illustrations are schematic and provided to convey functional relationships among subsystems. The relative dimensions, proportions, and placements of components may be varied, re-scaled, repositioned, consolidated, or distributed without departing from the scope of the invention.

1. Immersion System Architecture and Operating Environment

Figure 1B:
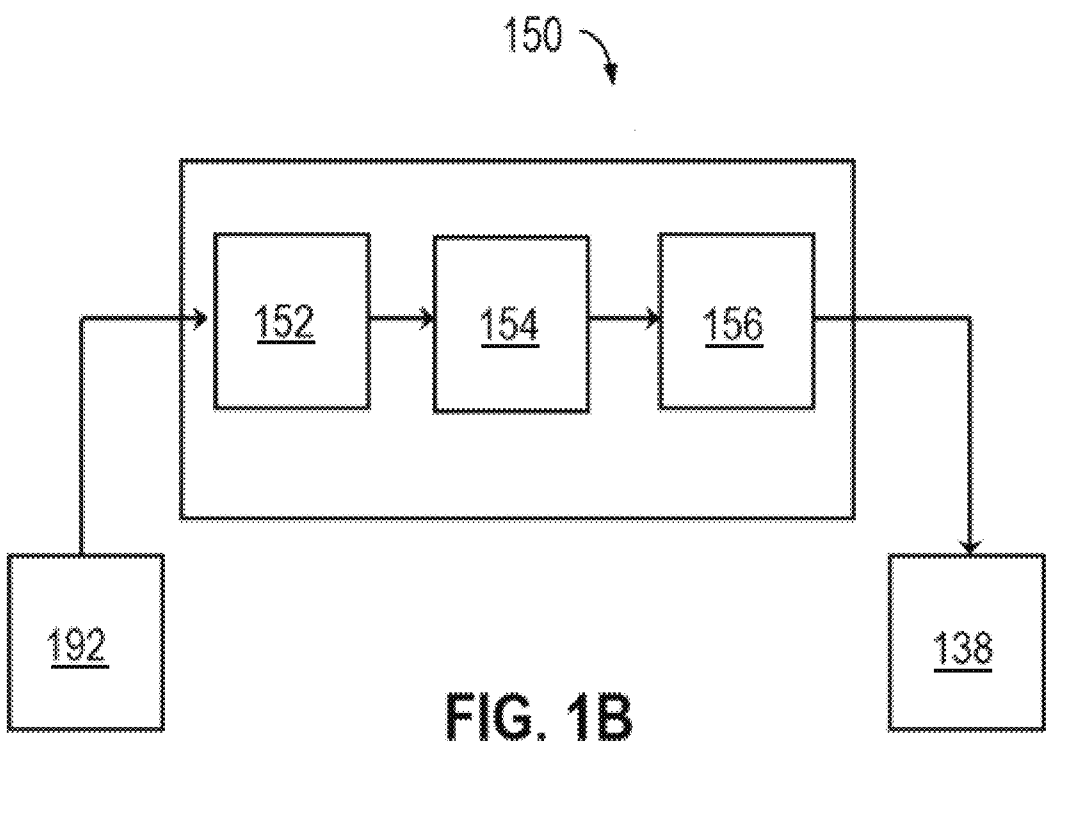
FIG. 1B shows a functional block diagram illustrating a predictive control subsystem and representative signal flow between sensors, control logic, and controllable system components.
Figure 7A:
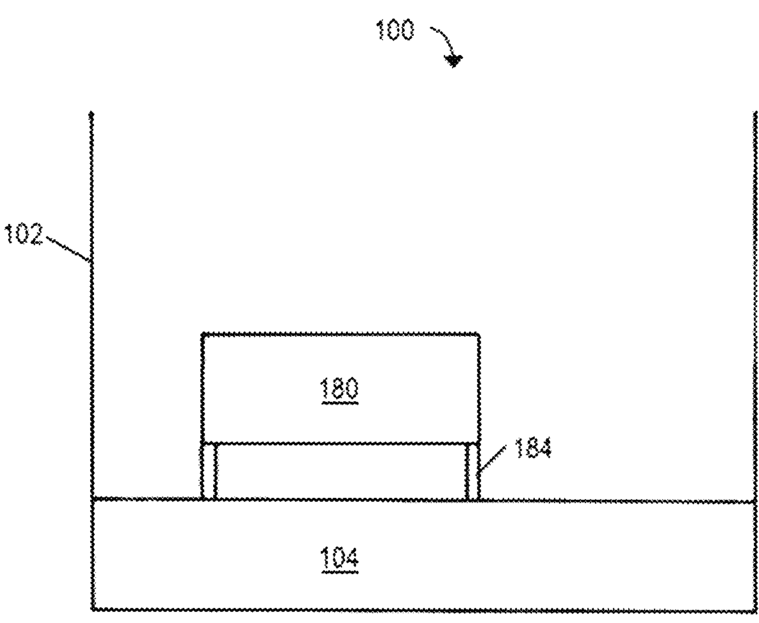
FIG. 7A shows a schematic view of an immersion tank assembly supporting one or more electronic devices.

Referring to FIGS. 1A, 1B, and 7A, an immersion cooling system (100) includes a tank, enclosure, or vessel defined by one or more walls (102) and a base (104). The tank is configured to contain a dielectric working fluid (160) suitable for electronic cooling and, in some embodiments, for phase-change operation. The tank may be sealed, vented, or partially open and may include access structures, mounting features, or structural reinforcements not shown.

One or more electronic devices or electronic modules (180) are positioned within the tank. The electronic devices may include processors, accelerators, memory devices, power electronics, networking hardware, storage devices, or combinations thereof. The electronic devices may be fully submerged, partially submerged, or selectively immersed during operation.

In some embodiments, one or more support structures (184) are disposed within the tank to position, retain, align, or mechanically support the electronic modules (180) relative to the tank (102, 104) and associated cooling subsystems. Such support structures may include frames, carriers, brackets, trays, rails, circuit boards, or composite mechanical assemblies and are not limited to any particular geometry or material.

The dielectric working fluid (160) may comprise a fluorinated dielectric fluid, a hydrocarbon-based fluid, a synthetic dielectric fluid, or other electrically non-conductive liquid capable of supporting single-phase or two-phase heat transfer. The particular fluid composition is not limiting, and system operation may be adapted to accommodate differing thermophysical properties, boiling points, vapor pressures, or regulatory constraints associated with the selected fluid.

2. Thermal Coupling and Heat-Spreading Structures

Figure 7B:
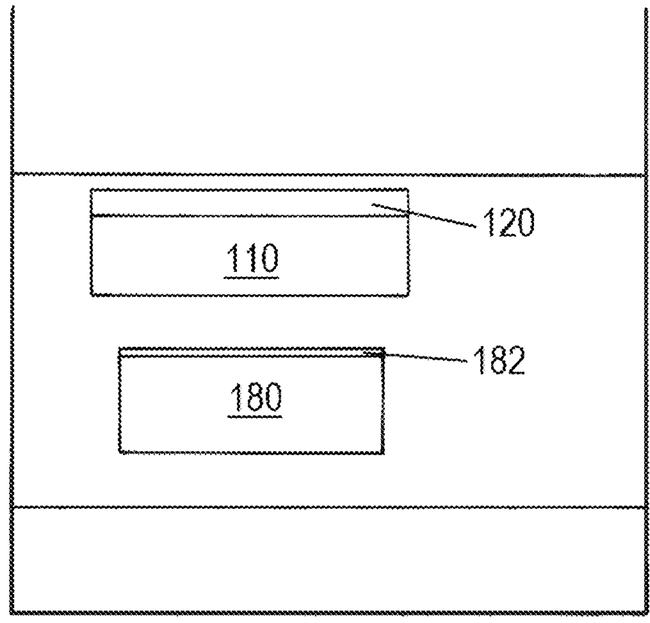
FIG. 7B shows a sectional view illustrating relative positioning of an electronic device, a heat-spreading structure, and a boiling-enhancement surface.

Referring to FIG. 7B, each electronic module (180) is thermally coupled, directly or indirectly, to a heat-spreading assembly (110) through a thermal interface (182). The thermal interface may include one or more layers of thermally conductive material, compliant materials, interface pads, adhesives, or mechanical coupling structures. The particular form of the thermal interface is not limiting.

Figure 2A:
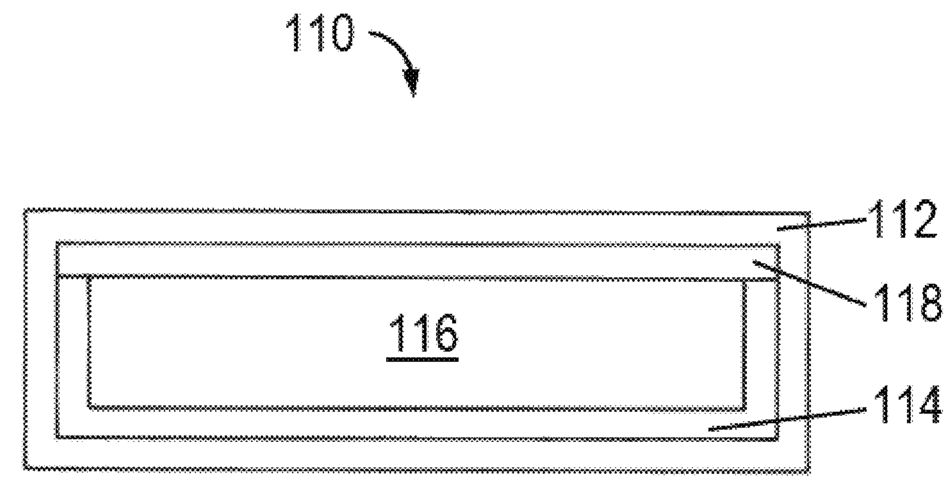
FIG. 2A shows a schematic cross-sectional view of a vapor-chamber heat-spreading assembly.

Referring to FIG. 2A, the heat-spreading assembly (110) may include a vapor-chamber structure, heat pipe, solid heat spreader, composite structure, or combinations thereof. In some embodiments, the heat-spreading assembly includes a casing (112) enclosing an internal wick structure (114), an evaporator region (116), and a condensate return region (118). In other embodiments, one or more of these features may be omitted or replaced with thermally equivalent alternatives.

The heat-spreading assembly functions to distribute heat generated by the electronic module and to deliver heat to an adjacent boiling interface in a controlled and spatially distributed manner.

3. Boiling-Enhancement Interface and Surface Engineering

Figure 2B:
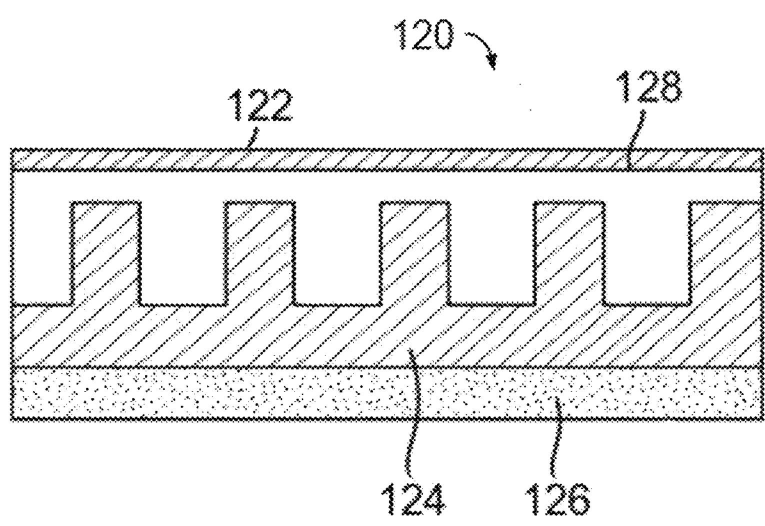
FIG. 2B shows an enlarged view of a boiling-enhancement surface illustrating representative microengineered surface features.
Figure 2C:
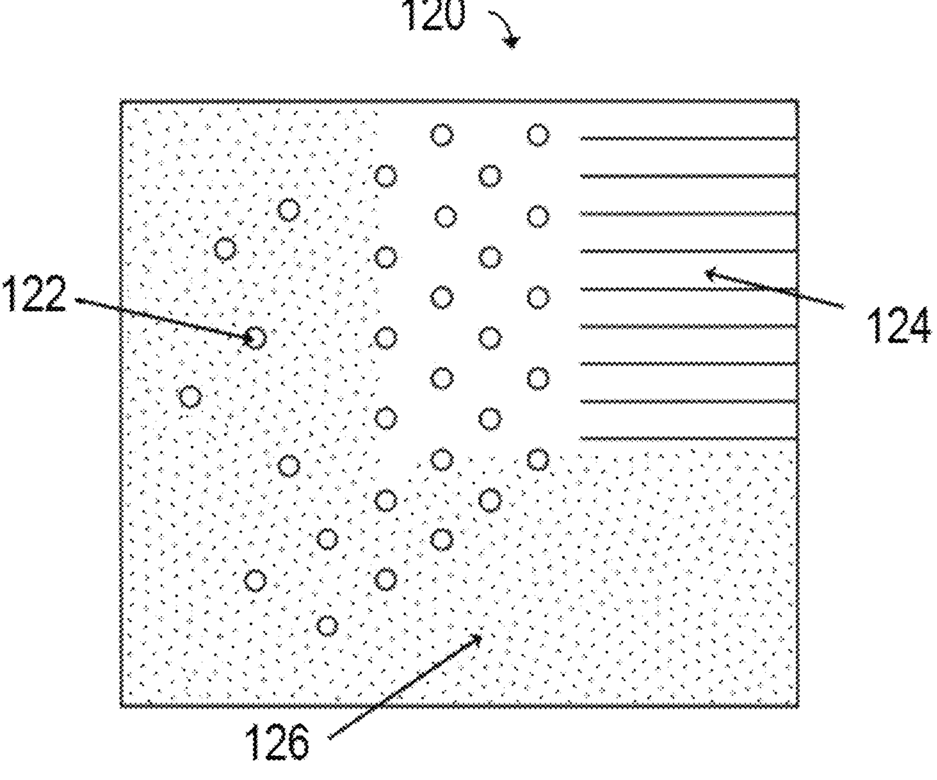
FIG. 2C shows a plan view of a boiling-enhancement surface illustrating a representative spatial arrangement of surface features.

Referring to FIGS. 2B and 2C, a boiling-enhancement surface (120) is positioned adjacent to, integrated with, or thermally coupled to the heat-spreading assembly (110). The boiling-enhancement surface is structured to promote stable nucleate boiling of the dielectric working fluid.

The boiling-enhancement surface may include one or more surface features such as nucleation structures (122), microgrooves or microchannels (124), porous wicking regions (126), surface-energy-modification regions (128), or combinations thereof. These features may be arranged uniformly or non-uniformly and may vary spatially based on predicted or inferred heat-flux distributions.

Feature size, spacing, geometry, orientation, and fabrication method may vary and are not limited to the illustrated examples. Features may be formed by machining, etching, additive manufacturing, coating, sintering, or other surface-modification techniques.

Figure 2D:
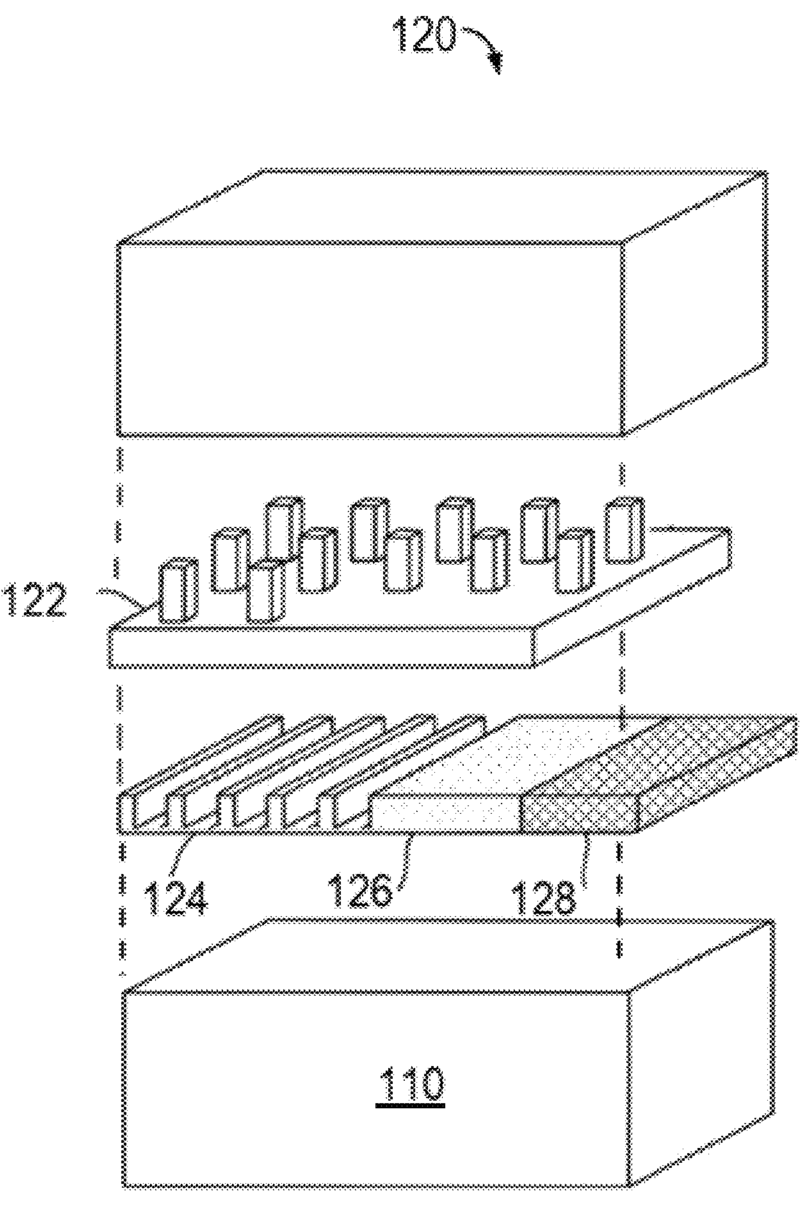
FIG. 2D shows an exploded schematic view illustrating an interface between a heat-spreading assembly and a boiling-enhancement surface.

Referring to FIG. 2D, the boiling-enhancement surface may be coupled to the heat-spreading assembly using direct bonding, intermediate layers, mechanical fastening, or other thermally conductive interfaces.

4. Two-Phase Boiling and Vapor Generation

Figure 3A:
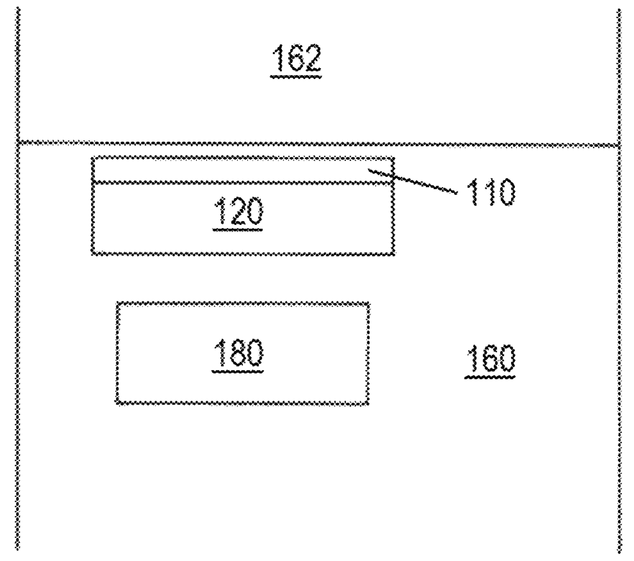
FIG. 3A shows a simplified schematic view illustrating heat transfer from a submerged electronic device to a boiling interface and resulting vapor generation.
Figure 3B:
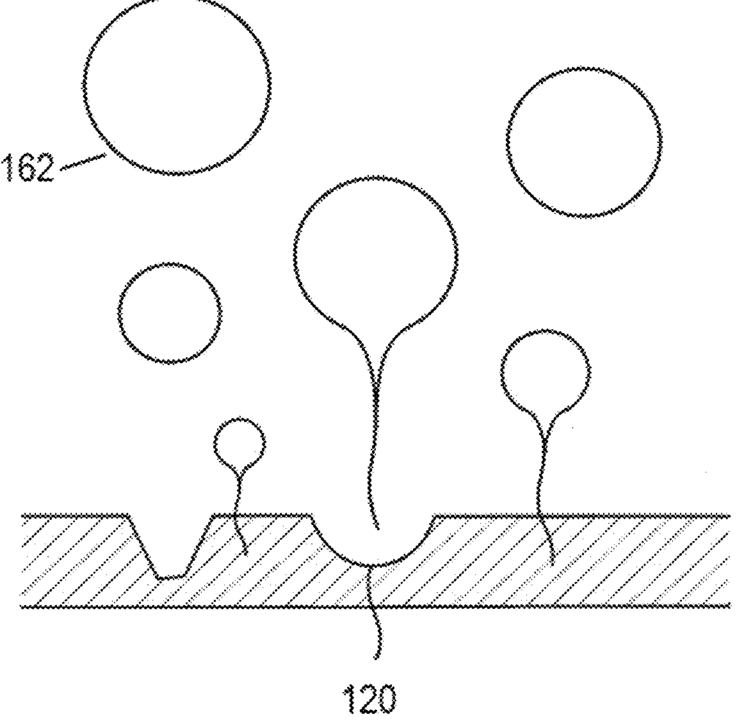
FIG. 3B shows a localized schematic view illustrating vapor generation and plume formation at a boiling interface.

Referring to FIGS. 3A and 3B, during operation, heat transferred from the electronic module (180) through the heat-spreading assembly (110) induces boiling of the dielectric working fluid at the boiling-enhancement surface (120). Vapor bubbles form at nucleation sites and detach into the surrounding fluid, forming localized or distributed vapor plumes.

The location, intensity, and temporal behavior of boiling may vary depending on heat load, surface condition, liquid replenishment, and system operating state. The invention does not require a particular boiling regime or bubble morphology.

5. Vapor Transport and Plume Management

Figure 3C:
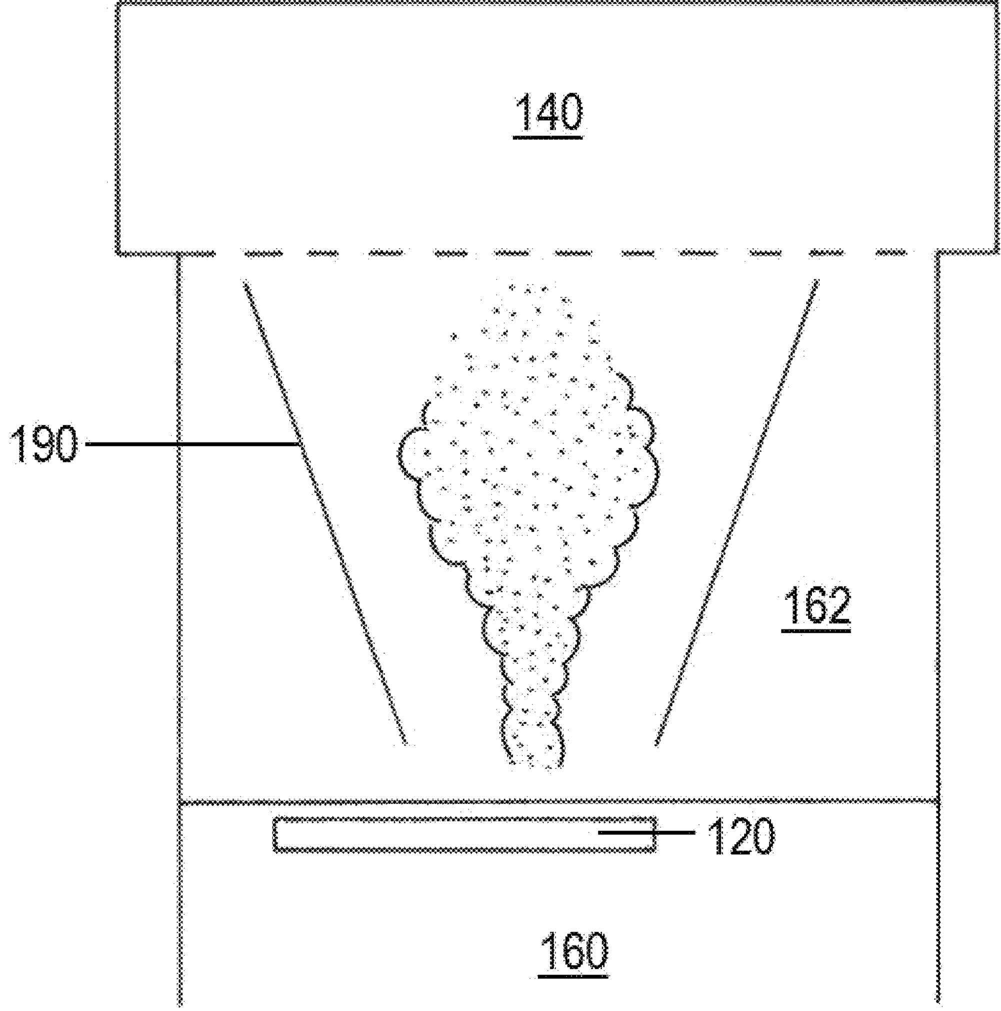
FIG. 3C shows a schematic view illustrating upward transport of vapor toward a condensation assembly.

Referring to FIG. 3C, vapor generated at the boiling interface migrates through a vapor region (162) toward one or more condensation regions. Vapor transport may be driven by buoyancy, pressure gradients, induced flow, or combinations thereof and may be influenced by tank geometry, internal structures, or vapor-routing features.

Referring to FIG. 3E, the drawings collectively illustrate representative vapor-liquid transport cycles and are intended to convey functional relationships rather than impose specific flow paths, phase boundaries, or spatial constraints.

6. Liquid Circulation and Fluid Movement (Optional)

Figure 6A:
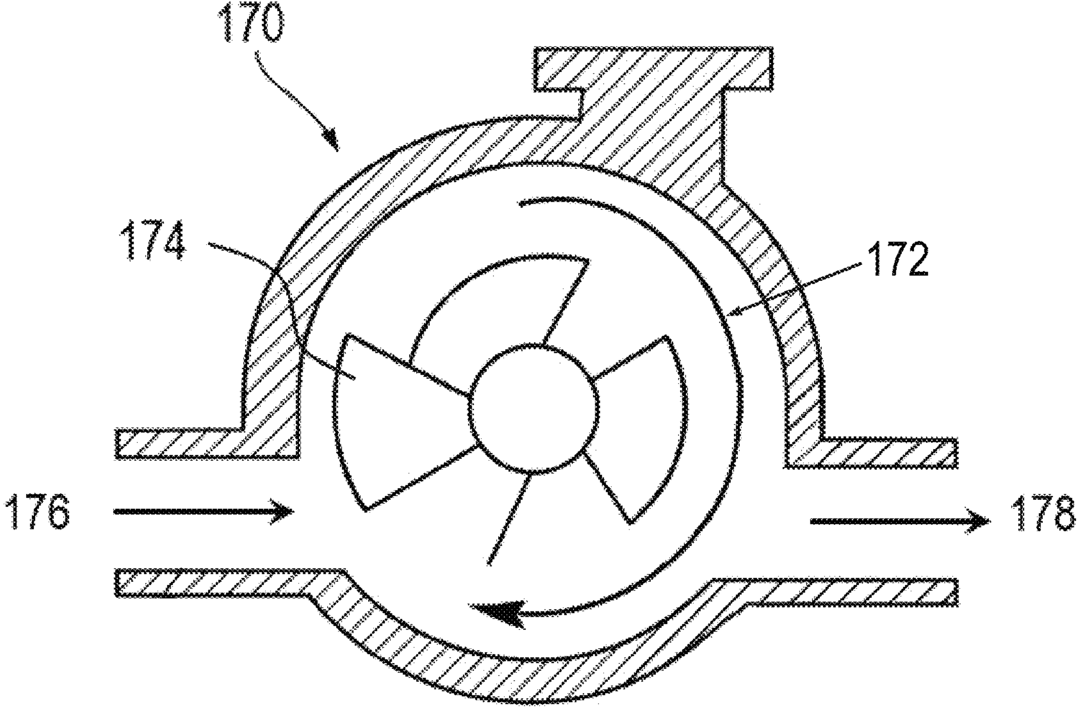
FIG. 6A shows a schematic view of a circulation driver illustrating intake, internal flow, and discharge paths.
Figure 6B:
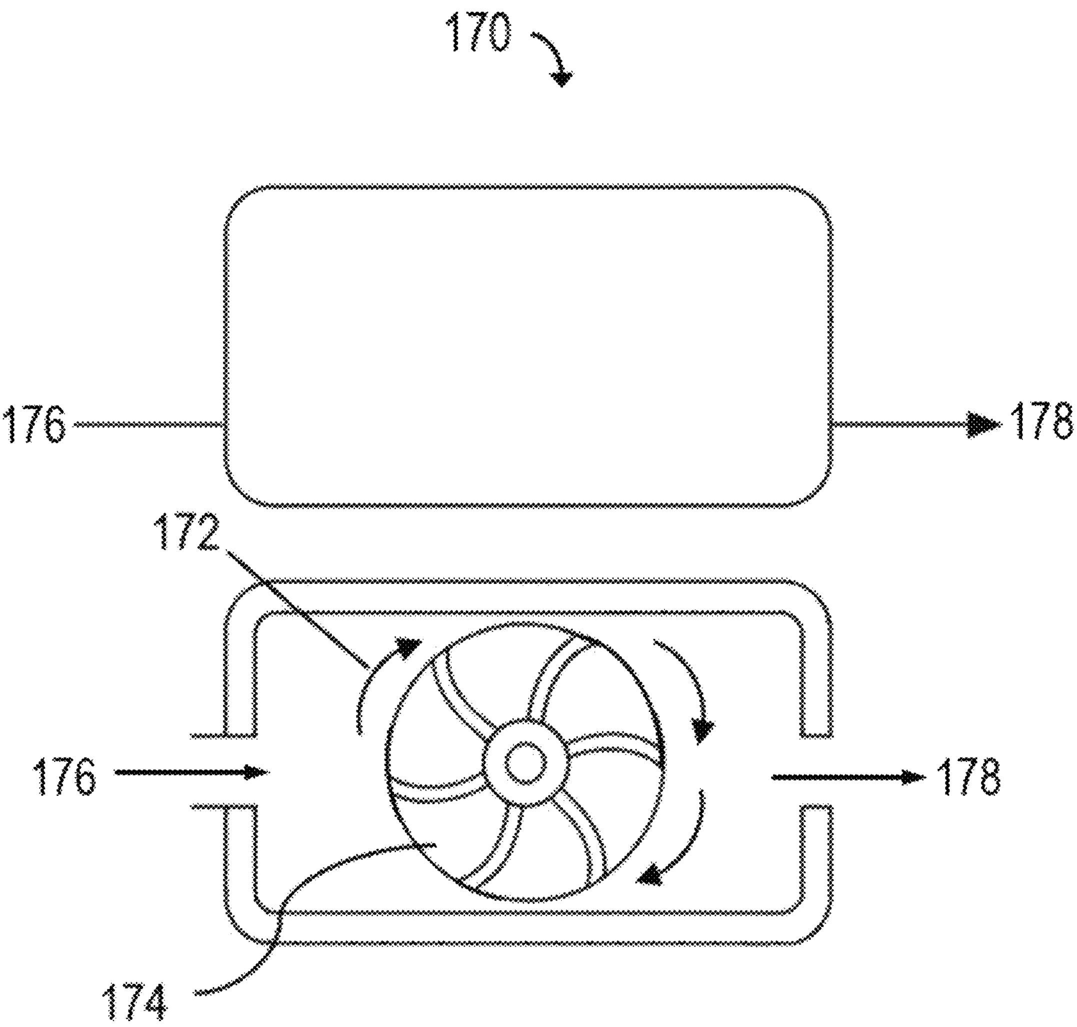
FIG. 6B shows orthographic and sectional views of a circulation driver illustrating internal flow relationships.

Referring to FIGS. 6A and 6B, the system may include a circulation driver (170) configured to move dielectric working fluid within the system. The circulation driver may include an intake path (176), an internal flow path (172) driven by a rotor or impeller (174), and a discharge path (178).

The circulation driver may be implemented as a pump, impeller, jet-based device, electrohydrodynamic driver, or other fluid-moving mechanism. In some embodiments, circulation may be passive or hybrid, and the circulation driver may be omitted entirely.

7. Directed Liquid Delivery and Injection Manifold

Figure 1C:
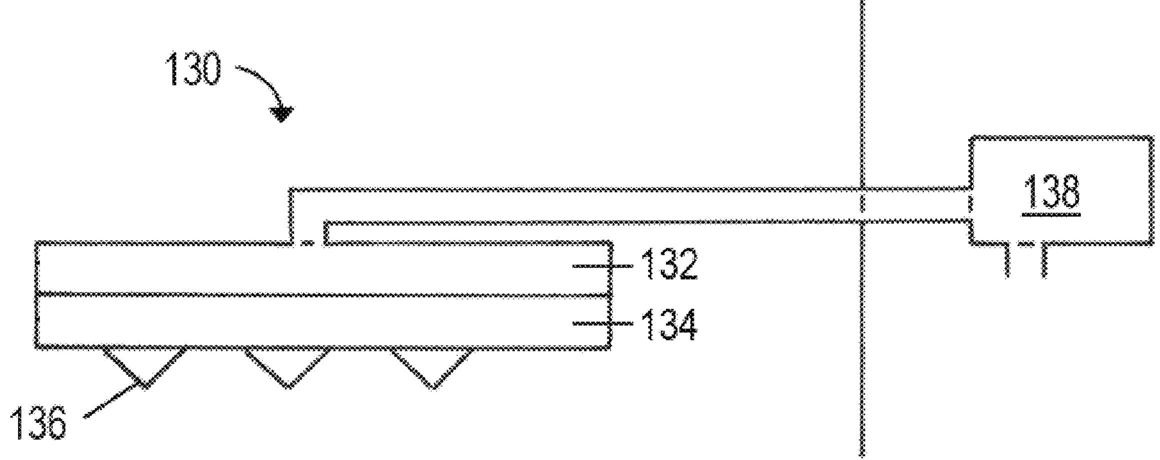
FIG. 1C shows a cutaway schematic view of a fluid-injection manifold assembly configured to distribute liquid dielectric working fluid toward a boiling interface.
Figure 1D:
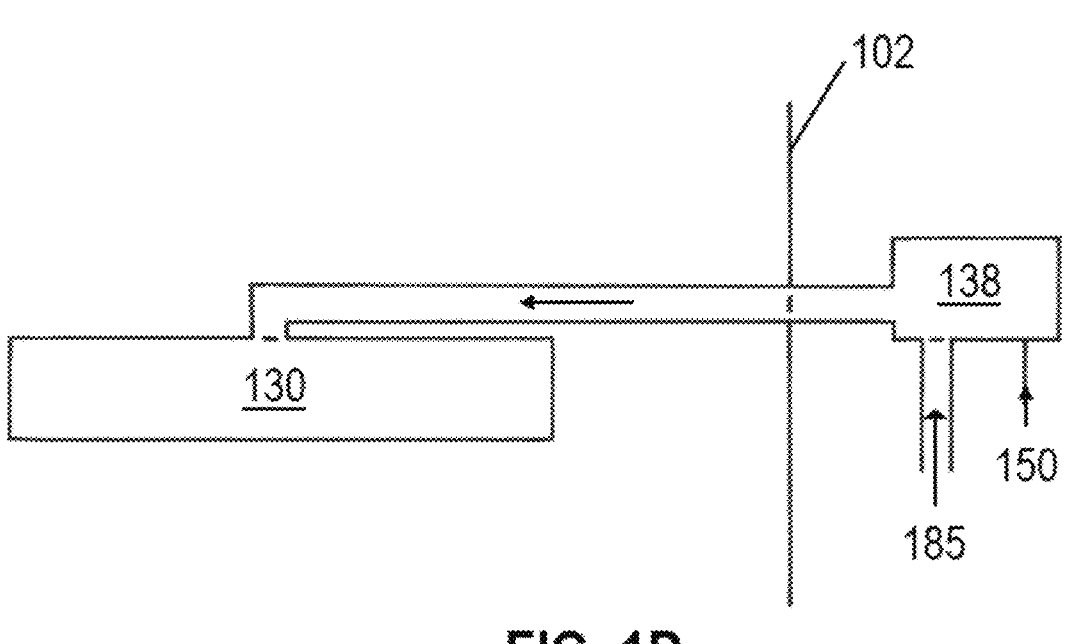
FIG. 1D shows a schematic view illustrating delivery of liquid dielectric working fluid from a liquid-delivery structure to a boiling-enhancement surface across a tank boundary, including representative flow-control elements and control coupling.

Referring to FIGS. 1A and 1C, the system may include a coolant-delivery subsystem configured to direct liquid-phase dielectric working fluid toward the boiling-enhancement surface. As shown in FIG. 1C, an injection manifold (130) may include feed conduits (132), distribution blocks (134), and injection ports (136).

The injection ports may deliver liquid as impingement jets, sprays, films, mists, or other flow forms. Liquid delivery may be continuous, intermittent, pulsed, spatially selective, or temporally modulated. Directed liquid delivery may reduce reliance on bulk fluid circulation, improve surface wetting, suppress vapor blanketing, or stabilize boiling behavior.

Flow-control elements (138), such as valves or restrictors, may regulate liquid delivery to the injection manifold. Such elements may be positioned internal to the tank, external to the tank, or partially external with sealed feedthroughs.

8. Flow Regulation and Bypass Structures

Figure 6C:
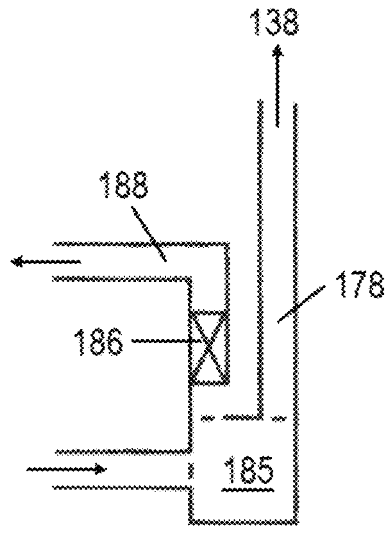
FIG. 6C shows a schematic diagram of a flow-regulation subsystem illustrating division of liquid flow between a primary delivery path and a bypass path.
Figure 6D:
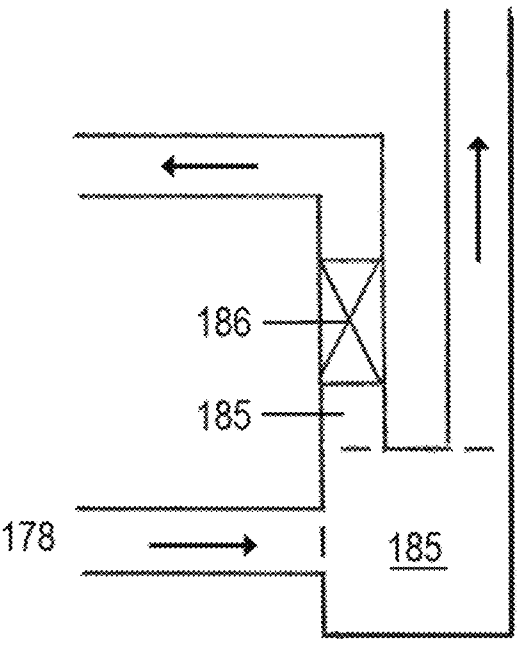
FIG. 6D shows an alternate configuration of the flow-regulation and bypass arrangement of FIG. 6C.

Referring to FIG. 6C, flow-regulation structures (185) may be provided to divide, redirect, throttle, or bypass liquid flow. A valve element (186) may be positioned along a bypass pathway (188) to selectively divert a portion of the liquid flow.

Flow-regulation structures may be located within the tank enclosure, external to the tank, or in remote fluid pathways and may operate independently of or in coordination with directed liquid delivery.

9. Condensation and Heat Rejection

Figure 4:
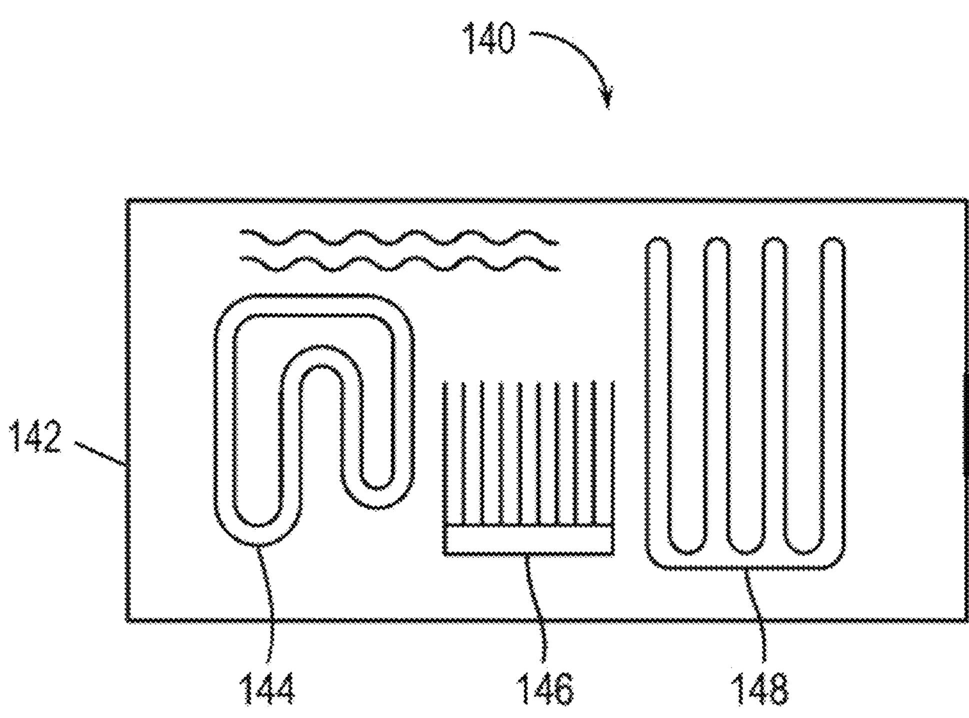
FIG. 4 shows a schematic diagram of a multi-mode condensation assembly including representative heat-rejection structures.
Figure 5:
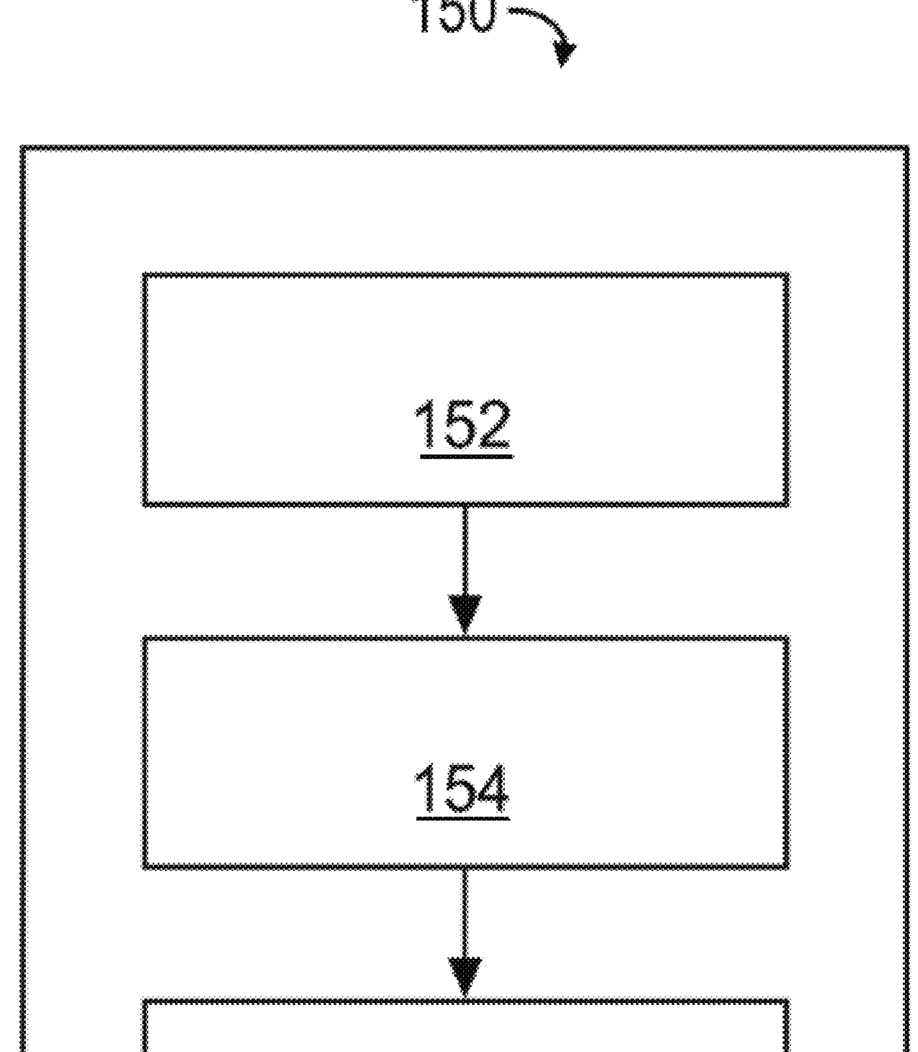
FIG. 5 shows a functional block diagram of a predictive control subsystem illustrating representative telemetry inputs, control logic, and command outputs.

Referring to FIG. 4, vapor generated within the system is directed toward one or more condensation assemblies (140). The condensation assemblies may include air-cooled heat-exchange structures (144), liquid-cooled heat-exchange structures (146), thermoelectric condensation-assist elements (148), or combinations thereof.

In some embodiments, the condensation assembly (140) includes a housing or structural body (142) that supports, encloses, or positions one or more heat-rejection structures relative to the vapor region.

10. Condensate Return and Fluid Management

Figure 3D:
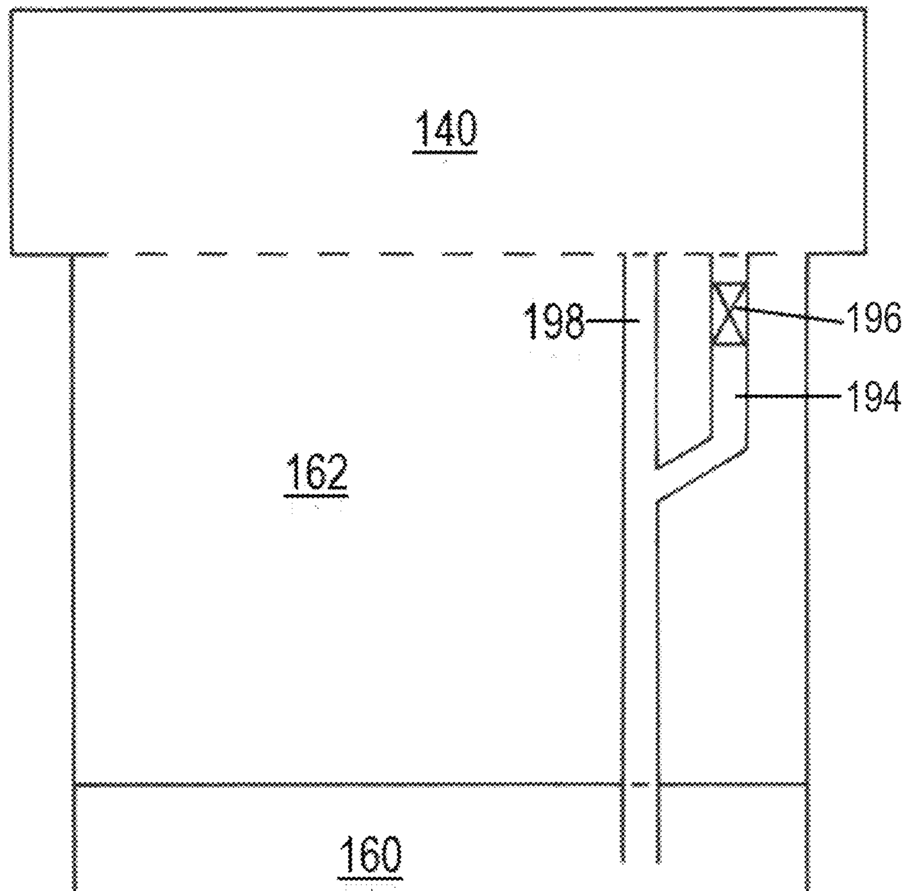
FIG. 3D shows a schematic view illustrating representative condensate return pathways from a condensation assembly, wherein FIGS. 3A-3D collectively illustrate aspects of a vapor-liquid transport cycle including boiling at a boiling interface, vapor rise toward a condensation region, condensation, and return of liquid dielectric working fluid.
Figure 7C:
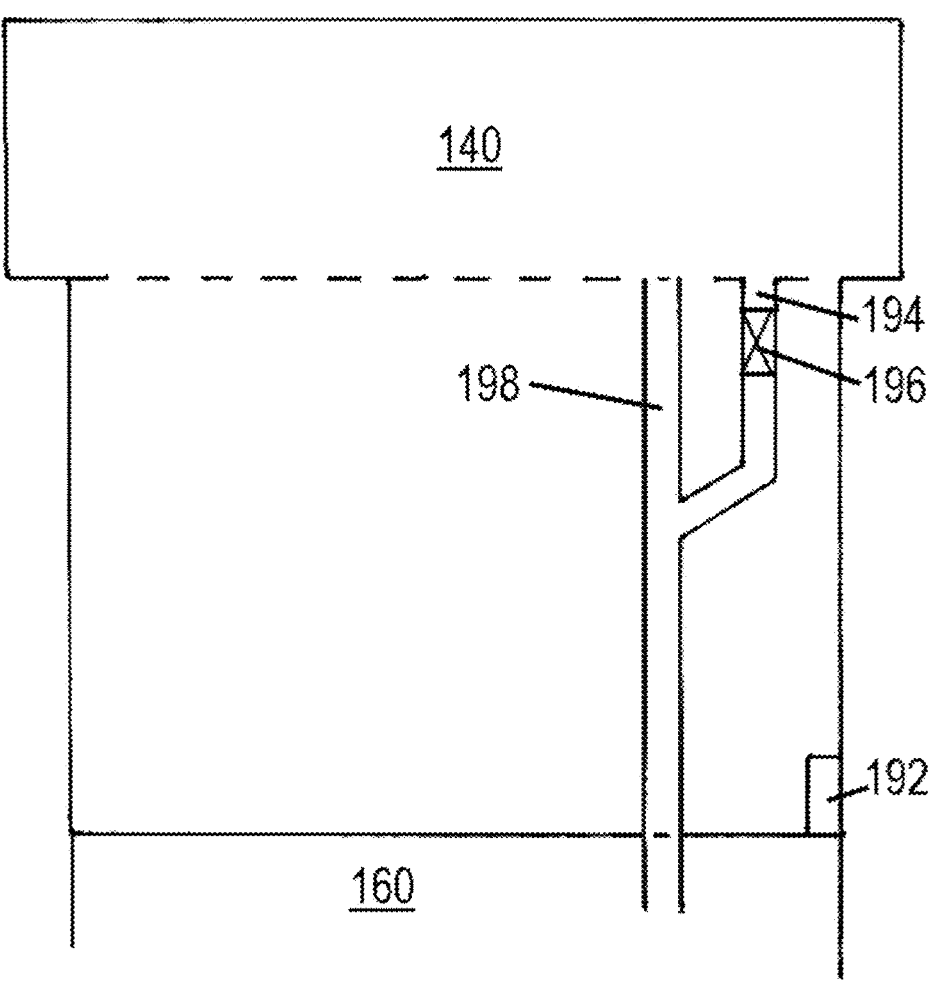
FIG. 7C shows a schematic view illustrating condensate return structures and a fluid-level sensing arrangement with respect to a condensation assembly.

Referring to FIGS. 3D and 7C, condensed dielectric liquid returns to the liquid region through one or more return pathways (194, 198). Return may be driven by gravity, capillary action, pressure differentials, or combinations thereof.

Check-valve structures (196) may inhibit backflow, and vapor-routing structures (190) may guide vapor plumes toward condensation regions.

11. Predictive Control and Telemetry Architecture

As described with reference to FIGS. 1B, 3, 5, and 7A-7D, the integrated two-phase immersion cooling system includes a predictive control subsystem configured to coordinate operation of fluid circulation, liquid injection, vapor condensation, and condensate return in response to sensed operating conditions. The predictive control subsystem may be implemented as a controller 150 that receives telemetry signals from sensors distributed throughout the system, including temperature sensors, pressure sensors, flow sensors, liquid-level sensors, and electrical load monitors associated with submerged electronic modules, fluid pathways, and condenser assemblies.

Telemetry signals are communicated to the controller 150 over a telemetry bus 152. Within the controller 150, inference logic 154 processes the received telemetry to identify operating states, detect trends, and anticipate future thermal or hydraulic conditions. The inference logic 154 may employ model-based, rule-based, statistical, or learned inference techniques, alone or in combination, without limitation to any particular implementation.

Based on outputs generated by the inference logic 154, the controller 150 generates coordinated control commands that are transmitted over a control bus 156 to regulate system components. Such components may include fluid-circulation drivers, injection-manifold valves, flow-regulation elements, and one or more condenser subsystems or condensation modes. Control actions may include modulation of liquid delivery toward boiling-enhancement surfaces, adjustment of vapor-handling capacity, selective activation of condenser pathways, or timing of condensate return.

Figure 7D:
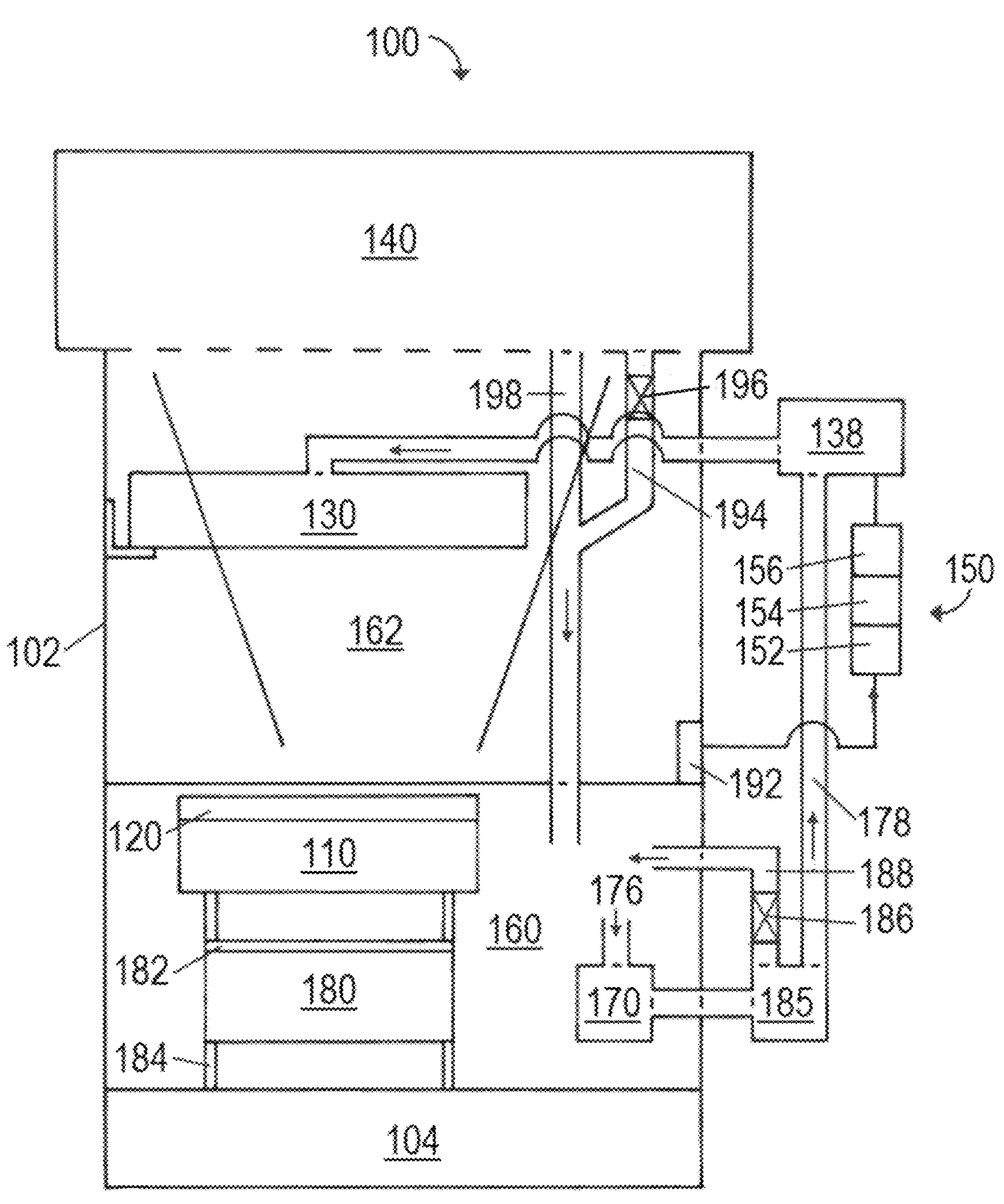
FIG. 7D shows a consolidated, system-level functional diagram illustrating cooperative interaction among an immersion tank, one or more electronic modules, a boiling-enhancement surface, liquid-delivery and circulation subsystems, condensation assemblies, condensate return pathways, sensors, and a predictive control subsystem.

Referring particularly to FIG. 7D, an operational control architecture is illustrated in which the predictive controller 150, including inference logic 154, operates in a closed-loop manner to coordinate liquid injection, vapor condensation, and condensate return behavior. By anticipating thermal transients and load variations, the inference logic 154 enables proactive control responses that stabilize nucleate boiling conditions, reduce oscillatory behavior, and improve overall thermal efficiency. FIG. 7D emphasizes functional control relationships rather than physical placement, complementing the structural and schematic views shown in the other figures.

12. Integrated, Hybrid, and Facility-Level Operation

The disclosed system is compatible with hybrid cooling architectures incorporating immersion cooling, direct-to-chip liquid cooling, facility cooling distribution units, or combinations thereof. The predictive control framework may coordinate operation across immersion subsystems and external cooling infrastructure to optimize efficiency, reliability, or heat-recovery objectives.

The system may operate in two-phase, single-phase, or mixed modes depending on operating conditions, fluid properties, or facility constraints.

13. Reliability, Maintainability, and Fault Response

The system may include fault-detection, redundancy, or safety features. Upon detection of abnormal conditions, such as unexpected vapor accumulation, flow restriction, or sensor failure, the control subsystem may adjust operating parameters, isolate subsystems, or transition the system to a reduced-energy or safe operating state.

14. Manufacturing, Variations, and Alternatives

Components may be manufactured using machining, molding, additive manufacturing, microfabrication, or surface-treatment processes. Variations in geometry, materials, control strategies, or operating modes that provide thermally equivalent functionality are within the scope of the invention.

15. Scope and Interpretation

The foregoing description is illustrative and not restrictive. The scope of the invention is defined by the appended claims and includes all equivalents that fall within the spirit and scope thereof. Individual features may be combined, omitted, repositioned, rescaled, or reordered without departing from the scope of the invention.

16. Consolidated System-Level Overview and Cooperative Operation (FIG. 7D)

Referring now to FIG. 7D, the figure provides a consolidated, system-level functional overview of the immersion cooling architecture described in Sections 1-15. FIG. 7D is intended to illustrate cooperative interaction among major subsystems, fluid regions, and control pathways disclosed throughout this Detailed Description and is not drawn to scale or intended to depict detailed internal construction.

As shown in FIG. 7D, an immersion cooling system 100 includes a tank or enclosure defined by walls 102 and a base 104 containing a dielectric working fluid 160. One or more electronic modules 180 are positioned within the working fluid and are mechanically supported by a support structure 184. The electronic modules 180 are thermally coupled, through a thermal interface 182, to a heat-spreading assembly 110, which supports or is thermally coupled to a boiling-enhancement surface 120, as described in Sections 2 and 3.

During operation, heat transferred from the electronic modules 180 through the thermal interface 182 and the heat-spreading assembly 110 to the boiling-enhancement surface 120 induces phase change of the dielectric working fluid, generating vapor that rises into a vapor region 162 above the boiling interface, consistent with the boiling and vapor-generation behavior described in Sections 4 and 5. Vapor within the vapor region 162 may be guided by one or more vapor-routing structures 190, which direct vapor toward one or more condensation assemblies 140, as described in Sections 9 and 10.

The condensation assemblies 140 condense the vapor and return liquid dielectric working fluid to the tank through one or more return pathways 194 and 198, optionally regulated by check-valve structures 196, thereby making the liquid available for recirculation.

Liquid-phase dielectric working fluid is supplied to a circulation driver or pump 170 through an intake path 176. The pump 170 delivers pressurized liquid along a discharge path 178, with flow along the discharge path conditioned or regulated by one or more flow-regulation elements 185.

Regulated liquid flow exiting the flow-regulation elements 185 may be directed through one or more flow-control elements 138, and from the flow-control elements 138 to an injection manifold 130 for distribution and delivery toward the boiling-enhancement surface 120, as described in Sections 7 and 8. A bypass pathway 188 branches from the flow-regulation elements 185 and is configured to divert liquid dielectric working fluid away from the flow-control elements 138 under selected operating conditions. A valve element 186 is disposed on the bypass pathway 188 and is configured to open automatically in response to elevated line pressure downstream of the flow-regulation elements 185, such elevated pressure being indicative of restricted flow through one or more flow-control elements 138, thereby diverting liquid dielectric working fluid through the bypass pathway 188.

One or more sensors 192 are distributed throughout the system and are configured to generate telemetry indicative of operating conditions, including temperature, pressure, flow, phase-change-related parameters, or other system states associated with the dielectric working fluid 160, vapor region 162, circulation pathways, or condensation assemblies 140.

A control subsystem 150, including inference logic 154, receives telemetry 152 from the sensors 192 and generates command signals 156 in accordance with the predictive regulation strategies described in Section 11. The inference logic 154 actively regulates operation of the flow-control elements 138 to control liquid delivery toward the boiling-enhancement surface 120, wherein restriction at the flow-control elements 138 may result in elevated line pressure that passively actuates diversion of liquid through the bypass pathway 188 via the valve element 186. The inference logic 154 may additionally regulate operation of the pump 170, including speed or duty cycle, to further optimize circulation efficiency, system stability, or energy consumption.

FIG. 7D illustrates only those components and regions necessary to understand the system-level architecture and predictive cooperative operation of the invention. Smaller components, internal flow structures, and detailed mechanical or micro-scale features are intentionally omitted or represented schematically and are described in greater detail with reference to other figures.

REFERENCE NUMERALS

100 Immersion cooling system
102 Tank wall
104 Tank base
110 Heat-spreading assembly
112 Vapor-chamber casing
114 Wick structure
116 Evaporator region
118 Condensate return region
120 Boiling-enhancement surface
122 Nucleation structures
124 Microgrooves or microchannels
126 Porous wicking regions
128 Surface modification regions
130 Injection manifold
132 Feed conduit
134 Distribution block
136 Injection port
138 Manifold-supply valve
140 Condenser assembly
142 Condenser housing
144 Air-cooled heat-exchange structure
146 Liquid-cooled heat-exchange structure
148 Condensation-assist element
150 Predictive control subsystem
152 Telemetry connection
154 Control logic
156 Command connection
160 Dielectric working fluid
162 Vapor region
170 Circulation driver
172 Internal pump flow path
174 Rotor or impeller
176 Intake path
178 Discharge path
180 Electronic module
182 Thermal interface
184 Support structure
185 Flow-regulation structure
186 Valve element
188 Bypass pathway
190 Vapor-routing structure
192 Fluid-level sensor
194 Secondary condensate return pathway
196 Check-valve structure
198 Condensate return pathway The claimed invention is:

1. A two-phase immersion cooling system for electronic devices, comprising:

a tank configured to contain a dielectric working fluid;

at least one electronic module disposed within the tank and at least partially submerged in the dielectric working fluid; a heat-spreading assembly thermally coupled to the electronic module; a boiling-enhancement surface operatively associated with the heat-spreading assembly and configured to promote controlled boiling of the dielectric working fluid; a liquid delivery subsystem comprising a manifold configured to direct dielectric liquid toward the boiling-enhancement surface; a condenser subsystem positioned to receive vapor generated at the boiling-enhancement surface and to condense vapor for return to the tank; a circulation subsystem configured to circulate the dielectric working fluid; and a control subsystem operatively coupled to the liquid delivery subsystem, the condenser subsystem, and the circulation subsystem, wherein the control subsystem is configured to;

(i) receive thermal telemetry associated with operation of the electronic module;

(ii) determine an anticipated change in thermal behavior of the electronic module; and (iii) initiate control actions affecting at least two of the liquid delivery subsystem, the condenser subsystem, and the circulation subsystem prior to occurrence of the anticipated change, such that response timing of the affected subsystems is coordinated relative to one another to reduce sequential response behavior during transient operating conditions.

2. The two-phase immersion cooling system of claim 1, wherein the control subsystem is configured to initiate at least one control action prior to a predicted thermal excursion of the electronic module.

3. The two-phase immersion cooling system of claim 1, wherein the liquid delivery subsystem is configured to selectively direct dielectric liquid toward the boiling-enhancement surface in response to a detected boiling condition at the surface.

4. The two-phase immersion cooling system of claim 3, wherein the detected boiling condition includes at least one of nucleate boiling, transitional boiling, or incipient dry-out.

5. The two-phase immersion cooling system of claim 1, wherein the condenser subsystem comprises plural condensation operating modes, and the control subsystem is configured to selectively activate or modulate at least one of the plural condensation operating modes.

6. The two-phase immersion cooling system of claim 5, wherein the plural condensation operating modes include at least two of air-cooled condensation, liquid-coupled condensation, or thermoelectric condensation.

7. The two-phase immersion cooling system of claim 1, further comprising one or more vapor-director structures disposed between the boiling-enhancement surface and the condenser subsystem, the vapor-director structures being configured to shape vapor flow paths independently of liquid flow paths.

8. The two-phase immersion cooling system of claim 1, wherein the heat-spreading assembly comprises a vapor chamber or heat-spreading plate configured to distribute thermal energy laterally prior to boiling.

9. The two-phase immersion cooling system of claim 1, wherein condensed dielectric working fluid returns to the tank through one or more guided return pathways.

10. The two-phase immersion cooling system of claim 1, wherein the tank, boiling-enhancement surface, liquid delivery subsystem, condenser subsystem, circulation subsystem, and control subsystem are operatively integrated such that control actions affecting one subsystem influence operation of at least one other subsystem.

11. The two-phase immersion cooling system of claim 1, wherein the control actions include modulation of liquid delivery toward the boiling-enhancement surface and selective activation of one or more condenser pathways.

12. A method of thermally managing at least one electronic module immersed in a dielectric working fluid, the method comprising: providing a boiling-enhancement surface thermally coupled to the electronic module; promoting boiling of the dielectric working fluid at the boiling-enhancement surface; providing a liquid delivery subsystem; directing dielectric liquid toward the boiling-enhancement surface using the liquid delivery subsystem; providing a circulation subsystem; circulating the dielectric working fluid using the circulation subsystem; providing a condenser subsystem having one or more condensation operating modes; condensing vapor generated by the boiling of the dielectric working fluid using the condenser subsystem; (i) receiving thermal telemetry associated with operation of the electronic module; (ii) determining an anticipated change in thermal behavior of the electronic module; and (iii) initiating control actions affecting at least two of the liquid delivery subsystem, the condenser subsystem, and the circulation subsystem prior to occurrence of the anticipated change, such that response timing of the affected subsystems is coordinated relative to one another to reduce sequential response behavior during transient operating conditions.

13. The method of claim 12, wherein the control actions are initiated prior to a predicted rise in temperature of the electronic module.

14. The method of claim 12, wherein directing dielectric liquid toward the boiling-enhancement surface is adjusted in response to detected boiling at the boiling-enhancement surface.

15. The method of claim 12, wherein the one or more condensation operating modes are selectively sequenced in response to vapor generation rate.

16. The method of claim 12, wherein determining the anticipated change is based at least in part on historical operating data associated with the electronic module.

17. A control subsystem for a two-phase immersion cooling system, the control subsystem comprising at least one controller and being configured to:

receive thermal telemetry associated with operation of an electronic module;

determine an anticipated change in thermal behavior of the electronic module; and generate predictive control outputs prior to occurrence of the anticipated change, the predictive control outputs affecting at least two of a liquid delivery subsystem, a condenser subsystem, and a circulation subsystem, such that response timing of the affected subsystems is coordinated relative to one another to reduce sequential response behavior during transient operating conditions.

18. The control subsystem of claim 17, wherein the thermal telemetry includes at least one of temperature data, pressure data, vapor flow data, liquid flow data, fluid-level data, or power-consumption data.

19. The control subsystem of claim 17, wherein the at least one controller generates predictive control outputs using rule-based, model-based, data-driven, or hybrid control logic.

20. The control subsystem of claim 17, wherein the at least one controller adjusts at least one of timing, rate, or spatial distribution of operation of the liquid delivery subsystem based on the thermal telemetry.

21. The control subsystem of claim 17, wherein the at least one controller transitions the cooling system into a reduced-energy operating state upon detecting sustained stable two-phase operating conditions.

* * * * *